United States Patent
Kameya et al.

(10) Patent No.: US 10,443,117 B2
(45) Date of Patent: Oct. 15, 2019

(54) PLASMA NITRIDING APPARATUS

(71) Applicant: IHI Corporation, Koto-ku (JP)

(72) Inventors: Norimitsu Kameya, Tokyo (JP); Kenji Fuchigami, Tokyo (JP)

(73) Assignee: IHI Corporation, Koto-ku (JP)

( * ) Notice: Subject to any disclaimer, the term of this patent is extended or adjusted under 35 U.S.C. 154(b) by 604 days.

(21) Appl. No.: 15/172,507

(22) Filed: Jun. 3, 2016

(65) Prior Publication Data

US 2016/0281207 A1  Sep. 29, 2016

Related U.S. Application Data

(63) Continuation of application No. PCT/JP2014/079303, filed on Nov. 5, 2014.

(30) Foreign Application Priority Data

Dec. 18, 2013  (JP) .................. 2013-260995

(51) Int. Cl.
  *C23C 8/36* (2006.01)
  *C23C 8/04* (2006.01)
  *H01J 37/32* (2006.01)

(52) U.S. Cl.
  CPC .................. *C23C 8/36* (2013.01); *C23C 8/04* (2013.01); *H01J 37/32366* (2013.01);
  (Continued)

(58) Field of Classification Search
  CPC ......... H01J 37/32018–32045; H01J 37/32366; H01J 37/32522; H01J 37/32568;
  (Continued)

(56) References Cited

U.S. PATENT DOCUMENTS 3,730,863 A * 5/1973 Keller ...................... C23C 8/36
                                                        204/164
3,761,370 A   9/1973 Keller
(Continued)

FOREIGN PATENT DOCUMENTS

JP         35-17303           11/1960
JP         47-6956 A          4/1972
(Continued)

OTHER PUBLICATIONS

Japanese Office Action dated May 15, 2018 in Patent Application No. 2013-260995, 3 pages.
(Continued)

*Primary Examiner* — Jeffrie R Lund
*Assistant Examiner* — Mirza Israr Javed
(74) *Attorney, Agent, or Firm* — Oblon, McClelland, Maier & Neustadt, L.L.P.

(57) ABSTRACT

A plasma nitriding apparatus includes: a surface treatment unit which includes a treatment tank to house part of a treatment object inclusive of a surface treatment region, and performs a nitriding treatment on the surface treatment region inside of the treatment tank by using plasma of a treatment gas; and an outer container which receives supply of the treatment gas, and houses the treatment object and the treatment tank so that a region of the treatment object other than the part is exposed from the treatment tank.

5 Claims, 2 Drawing Sheets

(52) U.S. Cl.
CPC .. *H01J 37/32522* (2013.01); *H01J 37/32568* (2013.01); *F05D 2220/323* (2013.01); *F05D 2230/90* (2013.01); *F05D 2240/61* (2013.01); *H01J 37/3244* (2013.01); *H01J 37/32513* (2013.01); *H01J 2237/327* (2013.01); *H01J 2237/3387* (2013.01)

(58) Field of Classification Search
CPC ......... H01J 2237/3387; H01J 37/32513; H01J 2237/327; H01J 37/3244; H01J 37/32091; H01J 37/32403; H01J 37/32477; H01J 37/32495; H01J 37/3255; C23C 8/36; C23C 8/04; F05D 2220/323; F05D 2230/90; F05D 2240/61
See application file for complete search history.

(56) References Cited

U.S. PATENT DOCUMENTS

| | | | | |
|---|---|---|---|---|
| 4,179,617 A | | 12/1979 | Tanaka et al. | |
| 4,221,972 A | * | 9/1980 | Oppel | C21D 1/38 219/780 |
| 4,342,918 A | * | 8/1982 | Tanaka | H01J 37/32018 266/250 |
| 4,371,787 A | | 2/1983 | Tanaka et al. | |
| 4,394,234 A | * | 7/1983 | Asahi | C23C 8/36 148/215 |
| 4,404,076 A | * | 9/1983 | Nakagawa | B05D 1/62 136/258 |
| 5,989,363 A | * | 11/1999 | Georges | C23C 8/36 148/222 |

FOREIGN PATENT DOCUMENTS

| | | |
|---|---|---|
| JP | 52-98633 | 8/1977 |
| JP | 52-146734 A | 12/1977 |
| JP | 55-14884 A | 2/1980 |
| JP | 2-213460 | 8/1990 |
| JP | 8-158038 | 6/1996 |
| JP | 2008-133518 | 6/2008 |
| JP | 2011-84793 | 4/2011 |

OTHER PUBLICATIONS

Extended European Search Report dated Jun. 27, 2017 in Patent Application No. 14870897.7.
English Translation of International Search Report dated Jan. 27, 2015 in PCT/JP2014/079303, filed Nov. 5, 2014.
Written Opinion dated Jan. 27, 2015 in PCT/JP2014/079303, filed Nov. 5, 2014.
Office Action dated Feb. 4, 2019 in European Patent Application No. 14 870 897.7, 4 pages.

* cited by examiner

PLASMA NITRIDING APPARATUS

CROSS REFERENCE TO RELATED APPLICATIONS

This application is a continuation application of International Application No. PCT/JP2014/079303, filed on Nov. 5, 2014, which claims priority to Japanese Patent Application No. 2013-260995, filed on Dec. 18, 2013, the entire contents of which are incorporated by reference herein.

BACKGROUND

1. Technical Field

The present disclosure relates to a plasma nitriding apparatus which nitrides part of a surface of a treatment object.

2. Description of the Related Art

A nitriding treatment to form a layer of a nitride compound having high hardness onto a metal surface has been known as one of surface treatments for improving abrasion resistance of the surface. Nitriding treatments are categorized broadly into a gas nitriding treatment and a plasma (ion) nitriding treatment. In the gas nitriding treatment, a nitrogen-containing gas such as ammonia gas is supplied around a treatment object. Then, the treatment object is heated and nitrogen originated from the nitrogen-containing gas is diffused on a surface of the treatment object. The diffused nitrogen is bonded to atoms on the surface whereby a layer of a nitride compound is formed. On the other hand, in the plasma nitriding treatment, a nitrogen-containing gas is supplied between an anode and a treatment object serving as a cathode. In this state, electric discharge is generated between the anode and the cathode to produce plasma. Nitrogen ions in the produced plasma collide with a surface of the treatment object, and the nitrogen ions are bonded to atoms on the surface. As a consequence, a layer of a nitride compound is formed on the surface of the treatment object (see Japanese Patent Application Laid-Open Publication No. 2011-84793).

SUMMARY

In the gas nitriding treatment, the treatment object is heated to 500° C. or above in order to stimulate generation of the nitride compound. In general, the treatment object is heated not locally but as a whole. In other words, if the treatment object is large in size and includes a relatively small region to be nitrided, then the majority of the heating cost would be spent for heating a region not to be nitrided. Meanwhile, the treatment object is housed in a container filled with the nitrogen-containing gas. Accordingly, generation of the nitride compound on the region not to be nitrided is blocked by subjecting the region to masking such as tinning. When the region not to be nitrided has a broad range, a manufacturing cost will be increased due to more work required for forming and removing the masking.

As with the gas nitriding treatment, the plasma nitriding treatment also heats the treatment object. Nevertheless, it is not necessary to raise the temperature as high as that in the gas nitriding treatment because the nitrogen ions are accelerated by an electric field in the plasma. However, in the conventional plasma nitriding treatment, the whole treatment object with masking provided on the region not to be nitrided is housed in a container filled with the nitrogen-containing gas as with the above-described gas nitriding treatment. As a consequence, when the region not to be nitrided has a broad range, there is concern about an increase in manufacturing cost attributed to replacement and discard of a large amount of the masking, consumption of a large amount of the nitrogen-containing gas, power consumption for the plasma, and other factors.

In view of the aforementioned circumstances, it is an object of the present disclosure to provide a plasma nitriding apparatus which is capable of suppressing an increase in manufacturing cost.

An aspect of the present disclosure is a plasma nitriding apparatus which is summarized to including: a surface treatment unit including a treatment tank to house part of a treatment object inclusive of a surface treatment region, and configured to perform a nitriding treatment on the surface treatment region inside of the treatment tank by using plasma of a treatment gas; and an outer container configured to receive supply of the treatment gas, and to house the treatment object and the treatment tank so that a region of the treatment object other than the part is exposed from the treatment tank.

The surface treatment unit may include an electrode disposed in the treatment tank in such a manner as to be opposed to the surface treatment region, and configured to produce the plasma between the electrode and the treatment object.

The surface treatment unit may include heating mean configured to heat the surface treatment region.

The heating mean may be an electric heater disposed on a side surface of the treatment tank away from the surface treatment region.

According to the present disclosure, it is possible to provide a plasma nitriding apparatus which is capable of suppressing an increase in manufacturing cost.

DESCRIPTION OF THE EMBODIMENTS

Figure 1:
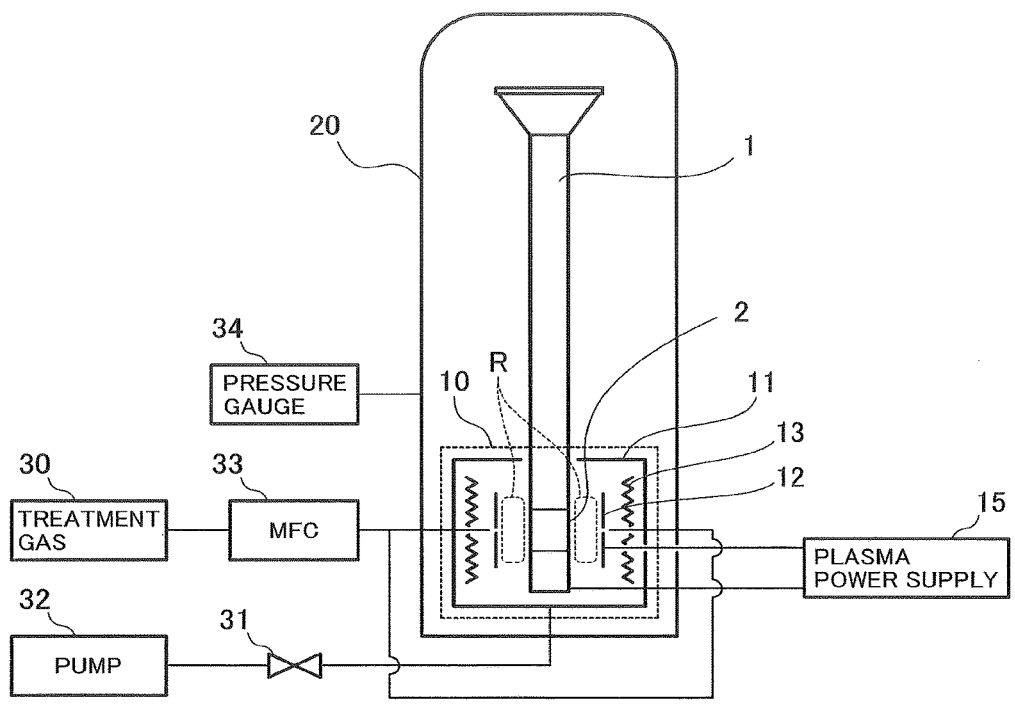
FIG. 1 is a schematic configuration diagram of a plasma nitriding apparatus according to an embodiment of the present disclosure.

A plasma nitriding apparatus according to an embodiment of the present disclosure will be described below with reference to the accompanying drawings. Note that portions common in the drawings will be denoted by the same reference signs and overlapping explanations will be omitted.

Figure 2:
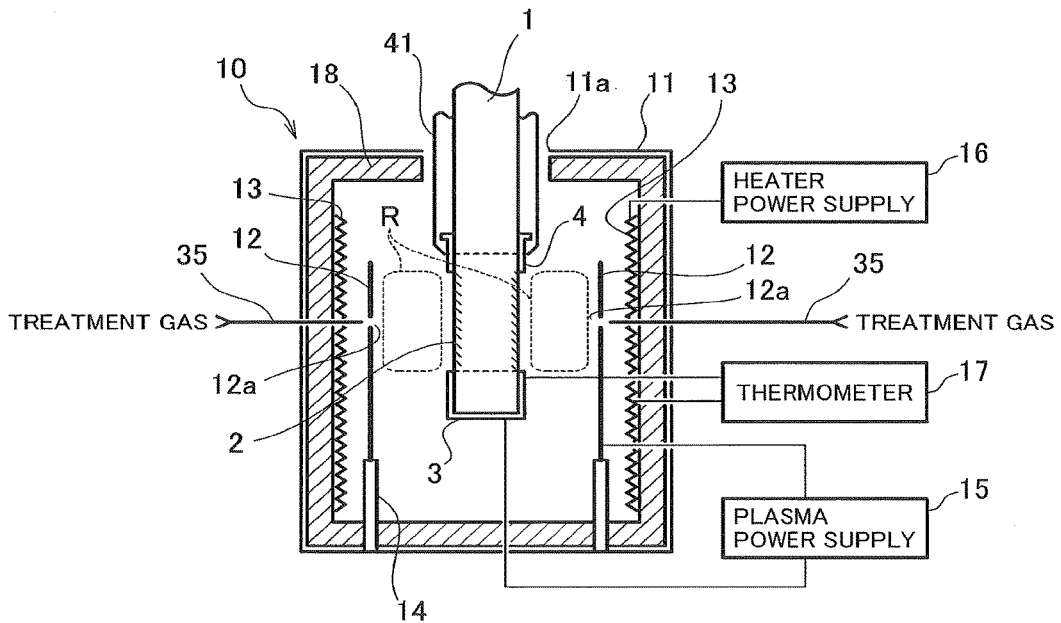
FIG. 2 is a diagram illustrating a detailed configuration of a surface treatment unit shown in FIG. 1.

FIG. 1 is a schematic configuration diagram of a plasma nitriding apparatus of this embodiment, and FIG. 2 is a diagram illustrating a detailed configuration of a surface treatment unit shown in FIG. 1. As shown in FIG. 1, the plasma nitriding apparatus of this embodiment includes a surface treatment unit 10 which performs a nitriding treatment on a surface treatment region 2 of a treatment object 1, and an outer container 20 which houses the surface treatment unit 10. Here, this embodiment assumes that the treatment object 1 is a metallic member having a hollow cylindrical shape and a length of several meters. Such a member includes a turbine shaft of an aircraft engine, for example. In FIG. 1, the surface treatment region 2 is defined on a circumferential surface located in the vicinity of a lower end portion of the treatment object 1.

As shown in FIG. 2, the surface treatment unit 10 includes a treatment tank 11, an electrode 12, and an electric heater 13 as a heating unit. The surface treatment unit 10 performs the nitriding treatment on the surface treatment region 2 of the treatment object 1 inside of the treatment tank 11 by using plasma of a treatment gas 30. Instead, the heating unit may be a device (a so-called infrared guide heating device) configured to generate infrared rays on the outside of the outer container 20 and to irradiate the surface treatment region 2 with the infrared rays.

The treatment tank 11 is a cylindrical container, for example, which has an opening 11a on its upper surface. It is desirable to set dimensions (i.e., a diameter, a height, and the like) of the treatment tank 11 to minimum required values in conformity to the dimensions and shape of the surface treatment region 2. The opening 11a is formed into a shape corresponding to a cross section of the treatment object 1 such that part of the treatment object 1 inclusive of the surface treatment region 2 can be housed in the treatment tank 11. In this embodiment, the opening 11a is formed only at one position as a round hole into which the treatment object 1 is inserted. Here, the dimension (the diameter) of the opening 11a is set to such a value that the treatment object 1 can be inserted through the opening 11a. Note that another opening (not shown) for stimulating the treatment gas 30 to flow in and out may additionally be provided to the treatment tank 11.

The electrode 12 is disposed in the treatment tank 11 in such a manner as to be opposed to the surface treatment region 2. Specifically, the electrode 12 is disposed on a lower surface of the treatment tank 11 via an insulating member 14 such as a ceramic. The electrode 12 is connected to a positive electrode of a plasma power supply 15, and functions as an anode to produce the plasma of the treatment gas 30 in a space R between the electrode 12 and the treatment object 1. The electrode 12 of this embodiment is formed into a cylindrical shape in such a way as to surround the outside of the surface treatment region 2. However, the shape and position of the electrode 12 can be changed depending on the location where the surface treatment region 2 is provided. For example, if a cylindrical or annular member is chosen as the treatment object and the surface treatment region is set to an inner surface thereof, then the electrode 12 is provided closer to the center axis of the member than the inner surface is. In this case, the electrode is formed either into a rod extending on the center axis or into a cylindrical shape having its center in conformity to the above-mentioned center axis. It is to be noted dotted lines in FIG. 1 and FIG. 2 each indicating the space R is illustrated only for the convenience of explanation and is not intended to definitively illustrate the region where the plasma is to be produced. The produced plasma is spread over the electrode 12 and the surface treatment region 2.

Introduction ports 12a for introducing the treatment gas 30 into the space R are formed in the electrode 12. The introduction ports 12a are formed at positions in the electrode 12, which are opposed to outlets of introduction pipes 35 for the treatment gas 30, and the treatment gas 30 reaches from the introduction pipes 35 directly to the space R through the introduction ports 12a. Accordingly, it is possible to achieve a required concentration of the treatment gas 30 for producing the plasma in the space R rapidly. In addition, it is possible to reduce an amount of the treatment gas 30 flowing out to a space where no plasma is produced, and thus to suppress an amount of consumption of the treatment gas 30. Here, the numbers of the introduction ports 12a and the introduction pipes 35 are set in accordance with the size of the treatment tank 11 (the space R).

The electric heater 13 heats the surface treatment region 2 in the course of the nitriding treatment. The electric heater 13 is formed from a publicly known heating wire, and is disposed on a side surface of the treatment tank 11 away from the surface treatment region 2. Specifically, the electric heater 13 is disposed between the side surface of the treatment tank 11 and the electrode 12. A heater power supply 16 is connected to the electric heater 13. A thermometer 17 measures a temperature of the electric heater 13. A result of measurement by the thermometer 17 is transmitted to a controller (not shown). Based on the result of measurement, the controller (not shown) controls an output of the heater power supply 16 in such a way as to set the temperature of the electric heater 13 to a predetermined temperature. Here, the electric heater 13 may be buried in a heat insulation material 18 to be described later.

As shown in FIG. 2, an inner surface of the treatment tank 11 is covered with the heat insulation material 18. The heat insulation material 18 prevents a drop in temperature in the treatment tank 11 and also prevents radiation heat of the electric heater 13 from being transmitted to the outside. The heat insulation material 18 is formed by using a non-combustible material with less discharge of gas. For example, the heat insulation material 18 is formed of a carbon fiber non-woven fabric (carbon felt), a ceramic plate, and the like.

The outer container 20 is a vacuum container to be evacuated with a pump 32 through a gate valve 31. The outer container 20 houses the treatment object 1 and the treatment tank 11 so that a region of the treatment object 1 other than the aforementioned part is exposed from the treatment tank 11. The treatment gas 30 used for the nitriding treatment is supplied to the treatment tank 11 through a mass flow controller 33. The treatment gas 30 is a gas containing nitrogen, which is a mixed gas of nitrogen and hydrogen, or ammonia gas, for example. A pressure gauge 34 is disposed in the outer container 20. The pressure gauge 34 measures a pressure inside the outer container 20. The mass flow controller 33 controls a flow rate of the treatment gas 30 based on the pressure measured with the pressure gauge 34. Here, the nitrogen gas and the hydrogen gas may be independently supplied by using separate mass flow controllers. In the meantime, a cleaning gas such as hydrogen or argon is supplied to the outer container 20, depending on its operating condition, by using another mass flow controller.

Figure 3:
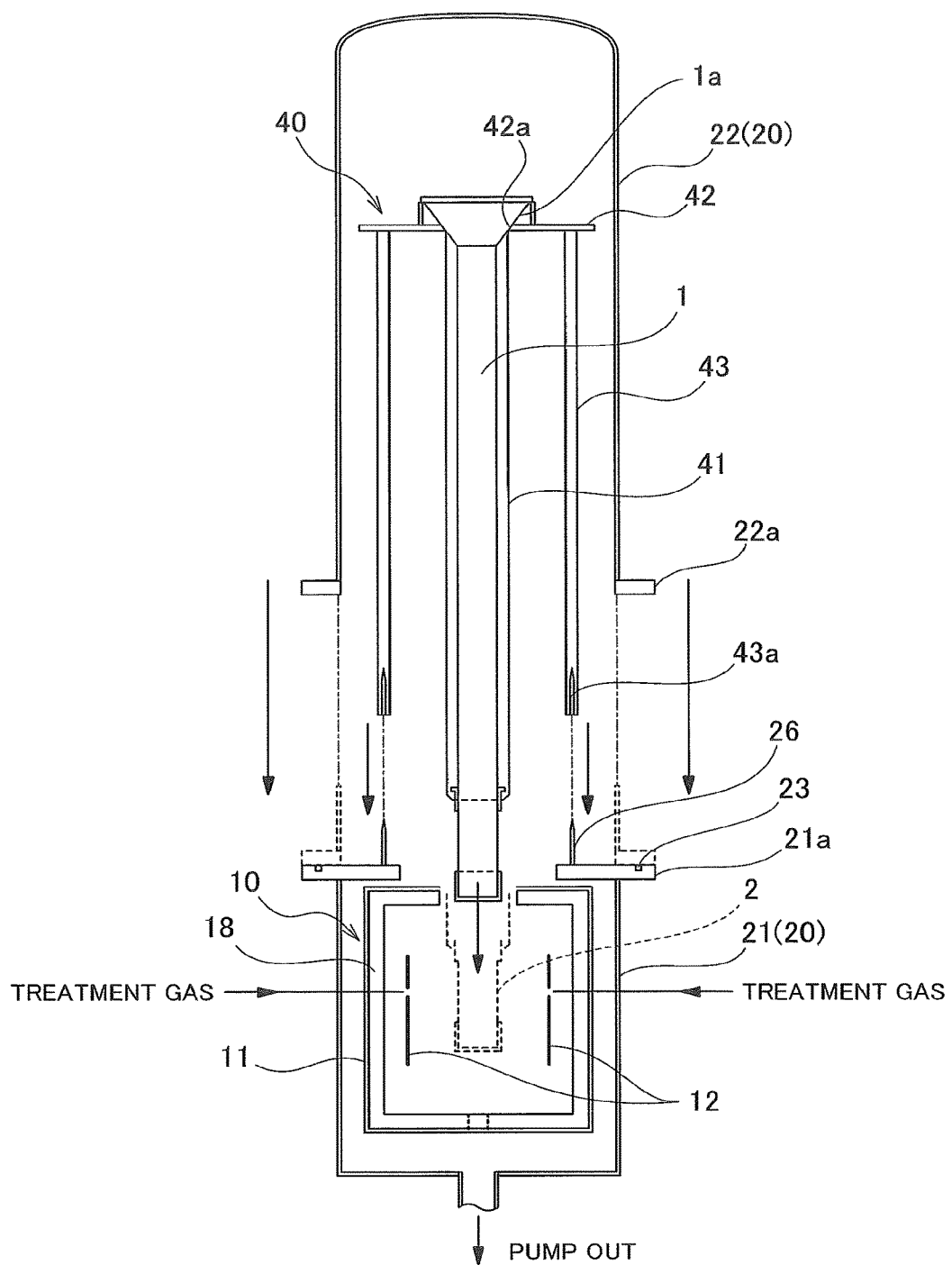
FIG. 3 is a diagram to explain procedures for disposing a treatment object in the plasma nitriding apparatus according to the embodiment of the present disclosure.

As shown in FIG. 3, the outer container 20 is formed from a lower container 21 to house the treatment tank 11, and an upper container 22 to house the region of the treatment object 1 exposed from the treatment tank 11. The treatment tank 11 is fixed to the outer container 20 by use of a given support member (not shown). A height in a vertical direction of the lower container 21 is set almost equal to a height of the treatment tank 11 so as to facilitate attachment and detachment of the upper container 22 and the treatment object 1 through an upper side. Here, when the upper container 22 is fixed to the lower container 21, flanges 21a and 22a of the containers are fastened to each other by using fixing members (not shown) such as bolts. At this time, an O-ring 23 held by the flange 21a gets squashed, thereby hermetically sealing the space inside the outer container 20. The above-mentioned treatment gas 30 is supplied from the introduction pipes 35, each of which is inserted into the vicinity of the corresponding introduction port 12a in the electrode 12. Meanwhile, the used gas is pumped out by the pump 32. Here, multiple positioning pins 26 designed to define a position of an attachment jig 40 are fixed to the flange 21a of the lower container 21 while being arranged in the circumferential direction of the flange 21a.

As shown in FIG. 3, the upper container 22 houses the region of the treatment object 1 protruding from the treatment tank 11 and the attachment jig 40 to support the treatment object 1. The upper container 22 is formed into a substantially cylindrical shape and a hanging member (not shown) such as an eyebolt is attached to an upper part thereof. A height of the upper container 22 is set to such a value that the upper part may not come into contact or interfere with an upper end portion of the treatment object 1. A diameter of the upper container 22 is also set to such a value that the upper container 22 may not come into contact or interfere with the attachment jig 40. In other words, a volume of the upper container 22 is set to such a value that is necessary and sufficient for housing the attachment jig 40 as well as the region of the single treatment object 1 protruding from the treatment tank 11. Thus, time required for evacuation is shortened and excessive filling of the treatment gas 30 is suppressed. Meanwhile, the appropriate design for executing the nitriding treatment on only one treatment object 1 makes it possible to set smaller dimensions in terms of the volume of the treatment tank 11 and the space R for the plasma.

In the plasma nitriding treatment, a masking cover 3 is attached to a lower end of the treatment object 1. The masking cover 3 is formed in conformity with the shape of the surface treatment region 2 and configured to prevent nitridation of the surface of the treatment object 1 other than the surface treatment region 2. The masking cover 3 is formed into a cylindrical shape by using an electrically conductive material with a thermal expansion coefficient equal to or close to that of the treatment object 1. The lower end of the treatment object 1 is inserted into the masking cover 3. At this time, the treatment object 1 comes into electrical contact with the masking cover 3. In the meantime, the masking cover 3 is connected to a negative electrode of the plasma power supply 15, thereby defining electric potential of the treatment object 1 relative to the electrode 12. The thermometer 17 measures a temperature of the masking cover 3, thereby indirectly measuring a temperature of the surface treatment region 2.

In the plasma nitriding treatment, a seal ring 4 is attached to a region of the treatment object 1 located above the surface treatment region 2. The seal ring 4 is formed into a cylindrical shape as with the masking cover 3. The treatment object 1 is inserted into the seal ring 4. As a result of the insertion, the seal ring 4 prevents nitridation of the surface other than the surface treatment region 2. In other words, the seal ring 4 is a mask (masking) that defines a boundary between the portion to be subjected to the nitriding treatment and the portion not to be subjected to the nitriding treatment. In this embodiment, the treatment object 1 is inserted into a cylindrical cover 41 of the attachment jig 40. The cylindrical cover 41 is electrically insulated from the treatment object 1. As with the seal ring 4, the cylindrical cover 41 prevents nitridation of the surface other than the surface treatment region 2 and also functions as a lagging member which suppresses radiation cooling of the treatment object 1. However, a lower end edge of the cylindrical cover 41 is located farther away from the surface treatment region 2 than a lower end edge of the seal ring 4. In other words, the seal ring 4 is attached to the treatment object 1 in such a way as to be exposed from the lower end edge of the cylindrical cover 41. The seal ring 4 is in electrical contact with the treatment object 1, and its portion near the surface treatment region 2 is nitrided in the plasma nitriding treatment.

The attachment jig 40 supports the treatment object 1 to be inserted into the treatment tank 11, and defines the position of the treatment object 1 inside the outer container 20. The attachment jig 40 includes: the aforementioned cylindrical cover 41 into which the treatment object 1 is inserted; a circular disc 42 which supports an upper end of the cylindrical cover 41; and guide rods 43 which define a height in the vertical direction of the surface treatment region 2 relative to the electrode 12. An opening 42a into which the treatment object 1 is inserted is formed at the center of the circular disc 42. The upper end of the cylindrical cover 41 is fixed to an end edge of the opening 42a. An upper end of each guide rod 43 is fixed to a portion of the circular disc 42 on the outside of the opening 42a, and a positioning hole 43a into which a positioning pin 26 is to be inserted is formed in a lower end of the guide rod 43. As described previously, a length of the guide rod 43 is set such that the surface treatment region 2 is opposed to the electrode 12.

Now, procedures of the plasma nitriding treatment will be described.

First, the seal ring 4 is fixed to the treatment object 1. Next, the treatment object 1 is inserted into the opening 42a in the attachment jig 40 and the treatment object 1 is attached to the attachment jig 40. The treatment object 1 may be simply placed on the attachment jig 40 or fixed to the attachment jig 40 by using fixing members such as bolts. A flare 1a is provided at the upper end of the treatment object 1 of this embodiment. The flare 1a is formed such that its diameter is gradually increased toward the upper end of the treatment object 1. A diameter of the opening 42a of this embodiment is set in a range from a minimum diameter to a maximum diameter of the flare 1a. Accordingly, the treatment object 1 is stably held onto the attachment jig 40 just by placing the flare 1a on the opening 42a. As a consequence, part of the seal ring 4 and the surface treatment region 2 of the treatment object 1 are exposed from a lower end of the cylindrical cover 41.

Next, the attachment jig 40 is placed on the flange 21a of the lower container 21 with the treatment object 1 being attached to the attachment jig 40. At this time, the positioning pins 26 on the flange 21a are inserted into the positioning holes 43a in the guide rods 43. The insertion defines the position of the treatment object 1 (the surface treatment region 2) relative to the outer container 20 (the treatment tank 11). After the attachment jig 40 is placed on the flange 21a, the upper container 22 is fixed to the lower container 21 and the space inside the outer container 20 is hermetically sealed.

Further, the air inside the outer container 20 is replaced with nitrogen gas by using the pump 32 and the mass flow controller 33. Specifically, the gate valve 31 is opened when the pressure inside the outer container 20 is equal to an atmospheric pressure, and then the pump 32 is started. The pump 32 evacuates the air inside the outer container 20, and the pressure inside the outer container 20 is reduced as a result of the evacuation. When the pressure gauge 34 detects a predetermined pressure, the gate valve 31 is closed and the mass flow controller 33 fills the outer container 20 with the nitrogen gas. Accordingly, moisture inside the outer container is eliminated. When the pressure inside the outer container 20 reaches the atmospheric pressure by filling the nitrogen gas, the mass flow controller 33 stops the supply of the nitrogen gas, and the gate valve 31 is opened again. As a consequence, the inside of the outer container 20 reaches a vacuum state again. Here, the above-described procedures of the discharge of the gas and the filling of the nitrogen gas may be conducted more than once.

When the pressure inside the outer container 20 is reduced to the predetermined pressure due to the re-discharge by the pump 32, the mass flow controller 33 fills the outer container 20 with the treatment gas 30. This filling is continuously performed while the plasma nitriding treatment is performed, so as to maintain the pressure inside the outer container 20 at a treatment pressure. Here, the treatment pressure means a pressure that can produce and maintain the plasma between the electrode 12 and the surface treatment region 2. More specifically, the treatment pressure is a pressure in a range from about 10 to 103 Pa.

When the pressure inside the outer container 20 reaches the treatment pressure, the heater power supply 16 starts power supply to the electric heater 13. Here, the temperature of the electric heater 13 is constantly monitored by the thermometer 17 and is used for controlling output power from the heater power supply 16. Thus, the surface treatment region 2 is heated to a desired temperature and generation of a nitride compound is stimulated.

As the temperature of the electric heater 13 is raised and reaches the desired temperature (such as 600° C.), the plasma power supply 15 applies a discharge voltage between the treatment object 1 and the electrode 12. The temperature of the surface treatment region 2 at this time is in a range of about 200° C. to 300° C. and is constant. Meanwhile, the discharge voltage is equal to 500 V, for example, and is periodical applied. When the discharge voltage is applied, an initial discharge between the treatment object 1 and the electrode 12 is induced, and then the initial discharge grows to the plasma of the treatment gas 30. Nitrogen ions in the plasma are accelerated toward the treatment object 1 as the cathode, and collide with the surface treatment region 2. The nitrogen ions and atoms on the surface generate the nitride compound as a consequence of the collision and the above-described heating.

A thickness (a depth) of a nitride compound layer is proportional to the time for producing the plasma when the temperature of the surface treatment region 2 is constant. Accordingly, as the passage of enough time for obtaining the desired thickness, the plasma power supply 15 stops the application of the discharge voltage while the heater power supply 16 stops the power supply to the electric heater 13. In conjunction therewith, the gate valve 31 is closed and the mass flow controller 33 stops the supply of the treatment gas 30. In other words, the cooling of the surface treatment region 2 is started under the treatment pressure. Thereafter, when the temperature of the electric heater 13 drops to a predetermined temperature, the mass flow controller 33 supplies the nitrogen gas until the pressure inside the outer container 20 reaches the atmospheric pressure. The supply of the nitrogen gas stimulates the cooling of the surface treatment region 2. Then, the treatment object 1 is taken out of the outer container 20 in accordance with prescribed procedures.

As described above, according to this embodiment, if the surface treatment region is local even though the treatment object is large in size, then it is possible to subject the surface treatment region to the plasma nitriding treatment just by producing the plasma in the surface treatment region and the vicinity thereof. In other words, consumption of the treatment gas is suppressed by providing the treatment tank so as to house only the surface treatment region and the vicinity thereof. Moreover, the electric power necessary for producing and maintaining the plasma can also be reduced since the region to produce the plasma becomes smaller. Thus, it is possible to minimize a region that requires the masking, and thus to reduce costs concerning replacement and discard of the masking. Furthermore, the single treatment object is the only target for the plasma nitriding treatment. In other words, only one treatment object is housed in the outer container and the plasma nitriding treatment is performed on only part of the treatment object. Accordingly, it is possible to reduce time necessary for evacuation, cooling after the nitriding treatment, and the like. Meanwhile, as compared to a conventional method of processing multiple treatment objects and then subjecting the objects to the nitriding treatment at the same time, this embodiment can perform the plasma nitriding treatment immediately after processing the treatment object. In other words, it is possible to perform the plasma nitriding treatment immediately on the treatment object, which is prone to significant surface modification such as oxidation right after the processing, without providing the treatment object with the masking for preventing such modification. As a consequence, according to this embodiment, it is possible to provide the plasma nitriding apparatus which is capable of suppressing a manufacturing cost at the time of the surface nitriding treatment.

Note that the present disclosure is not limited to the above-described embodiment, but shall be defined by the appended claims. The present disclosure also encompasses all the modifications with the meanings and scope equivalent to those defined in the claims.

What is claimed is:

1. A plasma nitriding apparatus comprising: a surface treatment unit including a treatment tank configured to receive supply of a treatment gas and house part of a treatment object inclusive of a surface treatment region, and the surface treatment unit is configured to perform a nitriding treatment on the surface treatment region inside of the treatment tank by using plasma of the treatment gas; an electrode disposed in the treatment tank and opposed to the surface treatment region to produce the plasma between the electrode and the treatment object and an outer container as a vacuum chamber, the outer container configured to house whole of the treatment object and the treatment tank while a region of the treatment object other than the part is exposed from the treatment tank, wherein the outer container includes a lower container which houses the treatment tank and an upper container which houses the region of the treatment object that is exposed from the treatment tank, the lower container and the upper container each including flanges which are fastened to each other when the upper container is fixed to the lower container, further comprising an attachment jig which supports the treatment object, the attachment jig including a cover into which the treatment object is inserted, a disc which supports an upper end of the cover, and guide rods which define a height in a vertical direction of the surface treatment region relative to the electrode, wherein an upper end of each of the guide rods is fixed to a portion of the disc and a positioning hole is formed in a lower end of each of the guide rods, each positioning hole cooperating with a positioning pin fixed to the flange of the lower container.

2. The plasma nitriding apparatus according to claim 1, wherein the surface treatment unit comprises a heating unit configured to heat the surface treatment region.

3. The plasma nitriding apparatus according to claim 2, wherein the heating unit is an electric heater disposed on a side surface of the treatment tank away from the surface treatment region.

4. The plasma nitriding apparatus according to claim 1, wherein the electrode is cylindrical around the treatment object as a center.

5. The plasma nitriding apparatus according to claim 2, further comprising a heat insulation material that covers a side surface of the treatment tank.

* * * * *